(12) United States Patent
Hsieh

(10) Patent No.: US 9,042,186 B2
(45) Date of Patent: May 26, 2015

(54) SOLID STATE DRIVE AND DATA ERASING METHOD THEREOF

(71) Applicant: LITE-ON TECHNOLOGY CORPORATION, Taipei (TW)

(72) Inventor: Shih-Hung Hsieh, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 88 days.

(21) Appl. No.: 13/920,159

(22) Filed: Jun. 18, 2013

(65) Prior Publication Data

US 2014/0219019 A1    Aug. 7, 2014

(30) Foreign Application Priority Data

Feb. 5, 2013  (CN) .......................... 2013 1 0045901

(51) Int. Cl.
| G11C 16/04 | (2006.01) |
| G11C 16/16 | (2006.01) |
| G11C 16/14 | (2006.01) |
| G11C 11/56 | (2006.01) |
| G11C 16/34 | (2006.01) |

(52) U.S. Cl.
CPC ................. *G11C 16/16* (2013.01); *G11C 16/14* (2013.01); *G11C 2216/18* (2013.01); *G11C 11/5635* (2013.01); *G11C 16/3418* (2013.01); *G11C 16/344* (2013.01)

(58) Field of Classification Search
CPC .... G11C 16/3445; G11C 16/14; G11C 16/16; G11C 2216/18
USPC .............. 365/185.29, 185.03, 185.18, 185.33
See application file for complete search history.

(56) References Cited

U.S. PATENT DOCUMENTS 8,493,793 B2 *   7/2013  Lee ........................... 365/185.22
8,644,082 B2 *   2/2014  Baek .......................... 365/185.3

* cited by examiner

*Primary Examiner* — David Lam
(74) *Attorney, Agent, or Firm* — WPAT, PC; Justin King

(57) ABSTRACT

A data erasing method of a solid state drive is provided. The solid state drive includes a memory module. The memory module includes a block. A data to be erased is stored in the block. The data erasing method includes steps of performing a first erasing operation to erase the block, programming the block after the first erasing operation, and performing a second erasing operation to erase the block.

8 Claims, 3 Drawing Sheets

SOLID STATE DRIVE AND DATA ERASING METHOD THEREOF

This application claims the benefit of People's Republic of China Application Serial No. 201310045901.8, filed Feb. 5, 2013, the subject matter of which is incorporated herein by reference.

FIELD OF THE INVENTION

The present invention relates to a data storage device and a data erasing method thereof, and more particularly to a solid state drive and a data erasing method thereof.

BACKGROUND OF THE INVENTION

As is well known, a solid state drive (SSD) is a data storage device that uses a non-volatile memory to store data. After data are written to the non-volatile memory, if the system is powered off, the data are still retained in the solid state drive. For example, the non-volatile memory is a flash memory.

Generally, the floating gate transistor of each cell of the flash memory has a floating gate to store hot carriers. Moreover, a storing state of the floating gate transistor is determined according to the amount of the stored hot carriers.

Depending on the bit amount of data to be stored in each cell, the flash memories may be classified into a single-level cell (SLC) flash memory and a multi-level cell (MLC) flash memory. The SLC flash memory can store only one bit of data per cell and distinguish two storing states from each other. The MLC flash memory can store at least two bits of data per cell and distinguish at least four storing states from each other. For example, if the MLC flash memory can store two bits of data per cell, the MLC flash memory can distinguish four storing states from each other.

FIG. 1 schematically illustrates the threshold voltage distribution curves of the MLC flash memory in different storing states. For example, the MLC flash memory can store two bits of data per cell. Before the cell is programmed, no hot carriers are injected into the cell. Consequently, the cell has the lowest threshold voltage (e.g. 0V). Under this circumstance, the cell may be considered to have a storing state "11" for example.

During the program cycle, if a first program voltage Vp1 is provided to the cell, a small number of hot carriers are injected into the cell. Consequently, the threshold voltage of the cell is increased to about 10V, and the cell may be considered to have a storing state "10". During the program cycle, if a second program voltage Vp2 is provided to the cell, more hot carriers are injected into the cell. Consequently, the threshold voltage of the cell is increased to about 20V, and the cell may be considered to have a storing state "01". During the program cycle, if a third program voltage Vp3 is provided to the cell, the largest number of hot carriers are injected into the cell. Consequently, the threshold voltage of the cell is increased to about 30V, and the cell may be considered to have a storing state "00". That is, the magnitude of the third program voltage Vp3>the magnitude of the second program voltage Vp2>the magnitude of the first program voltage Vp1.

From the above discussions, the threshold voltage of the floating gate transistor is changed after the cell is programmed. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

That is, during the program cycle of the solid state drive, the amount of hot carriers to be injected into the floating gate are controlled according to the magnitude of the program voltage, and thus the threshold voltage of the floating gate transistor is changed to result in different storing states. Moreover, during a read cycle, a sensing circuit of the solid state drive may determine the storing state of the floating gate transistor according to the threshold voltage of the floating gate transistor.

Generally, before the solid state drive is used, no data have been programmed into the flash memory. Under this circumstance, the cell of the flash memory has the storing state corresponding to the lowest threshold voltage. For example, as shown in FIG. 1, the cell of the flash memory has the storing state "11" before the flash memory is used.

FIG. 2 is a flowchart illustrating a method of using a conventional solid state drive. After the solid state drive is used, the data are programmed into the flash memory (Step S202).

After the data are programmed, the data may be read from the flash memory by a host (Step S204). Generally, the times of reading the data from the flash memory are not restricted.

When the data in the flash memory are no longer used, the data of the flash memory are erased during an erase cycle (Step S206). Moreover, during the erase cycle of the solid state drive, an erase voltage is provided to erase the data.

After the operations of the erase cycle of the solid state drive are completed, the cell of the flash memory is changed to an erase state. Consequently, the data may be programmed again (Step S202). Generally, the erase state of the cell is the storing state with the lowest threshold voltage. For example, if the flash memory can store two bits of data per cell, after the cell is erased, the cell is restored to the storing state "11".

Moreover, it is found that the use life of the solid state drive is related to the erase count. Ideally, after the erase cycle of the solid state drive is completed, the cell should be restored to the storing state "11", and no hot carriers are retained in the floating gate transistor. However, in practice, some of the hot carriers are possibly retained in the floating gate transistor and fail to be completely removed. Moreover, after many times of subsequent program cycles and erase cycles, the hot carriers are continuously accumulated in the floating gate and the gate oxide layer. Consequently, the use life of the solid state drive is shortened.

SUMMARY OF THE INVENTION

The present invention provides a data erasing method of a solid state drive for effectively reducing the number of hot carriers that are retained in the floating gate and the gate oxide layer. Consequently, the hot carriers are not continuously accumulated, and the use life of the solid state drive is extended.

An embodiment of the present invention provides a data erasing method of a solid state drive. The solid state drive includes a memory module. The memory module includes a block. A data to be erased is stored in the block. The data erasing method includes steps of performing a first erasing operation to erase the block, programming the block after the first erasing operation, and performing a second erasing operation to erase the block.

Another embodiment of the present invention provides a solid state drive. The solid state drive includes a memory module and a controlling unit. The memory module includes a block, wherein a data to be erased is stored in the block. The controlling unit is used for providing a program voltage to the memory module during a program cycle. Moreover, the controlling unit is used for sequentially performing a first erasing operation to erase the block, programming the block and performing a second erasing operation to erase the block during an erase cycle.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
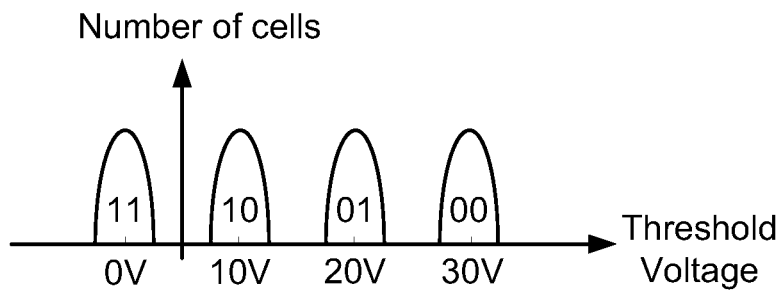
FIG. 1 (prior art) schematically illustrates the threshold voltage distribution curves of the MLC flash memory in different storing states.
Figure 2:
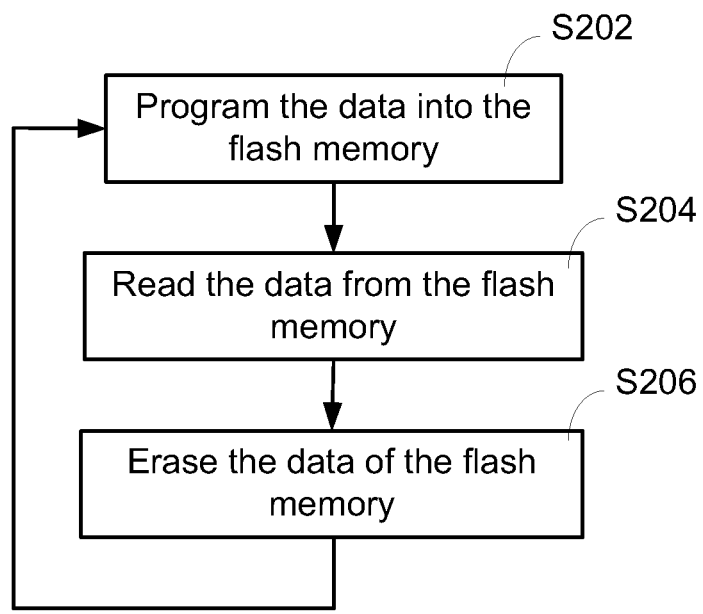
FIG. 2 (prior art) is a flowchart illustrating a method of using a conventional solid state drive.

As known, the use life of the solid state drive is related to the erase count. In addition, the use life of the solid state drive is also related to the storing state before the erase cycle. Hereinafter, the flash memory of the solid state drive for storing two bits of data per cell will be illustrated for example. In a case where the cell is repeatedly programmed to have the storing state "00" and the cell is erased to have the storing state "11", after about 1000 times of the repeat program and erase cycle, the solid state drive may fail to program the cell. Meanwhile, the cell cannot be used.

Alternatively, in another case where the cell is repeatedly programmed to have the storing state "01" and the cell may be erased to have the storing state "11", after about 2000 times of the repeat program and erase cycle, the solid state drive may fail to program the cell.

Alternatively, in another case where the cell is repeatedly programmed to have the storing state "10" and the cell may be erased to have the storing state "11", after about 3000 times of the repeat program and erase cycle, the solid state drive may fail to program the cell.

From the above discussions, the times of the repeat program and erase cycle are related to the difference between the threshold voltage corresponding to the programmed storing state and the threshold voltage corresponding to the erased storing state. The difference between the threshold voltage of the cell in the storing state "00" and the threshold voltage of the cell in the storing state "11" is the largest. Consequently, when a cell is erased from the storing state "00" to the storing state "11", the floating gate and the gate oxide layer are the most likely suffered from defects. Once the hot carriers are trapped into the defects, it is difficult to dissipate the hot carriers. After many times of the repeat program and erase cycle, more hot carriers are retained and accumulated in the floating gate and the gate oxide layer. Consequently, the use life of the cell is deteriorated.

On the other hand, the difference between the threshold voltage of the cell in the storing state "10" and the threshold voltage of the cell in the storing state "11" is the lowest. Consequently, when a cell is erased from the storing state "10" to the storing state "11", the hot carriers can be removed from the floating gate and the gate oxide layer more easily. After many times of the repeat program and erase cycle, the hot carriers are not easily retained and accumulated in the floating gate and the gate oxide layer. Consequently, the number of times of programming and erasing the cell will be increased.

In other words, if the difference between the threshold voltage of the cell before erased and the threshold voltage of the cell in the erase state is lower, the hot carriers can be removed from the floating gate and the gate oxide layer more easily during the erase cycle. Consequently, the hot carriers are not easily retained and accumulated in the floating gate and the gate oxide layer.

However, since the stored data are usually random data, some of the cells may be repeatedly programmed to the storing state with the higher threshold voltage and then erased. In accordance with the present invention, the random data are taken into consideration. The present invention provides a data erasing method of a solid state drive for effectively reducing the number of hot carriers that are retained in the floating gate and the gate oxide layer after the erase cycle.

Figure 3:
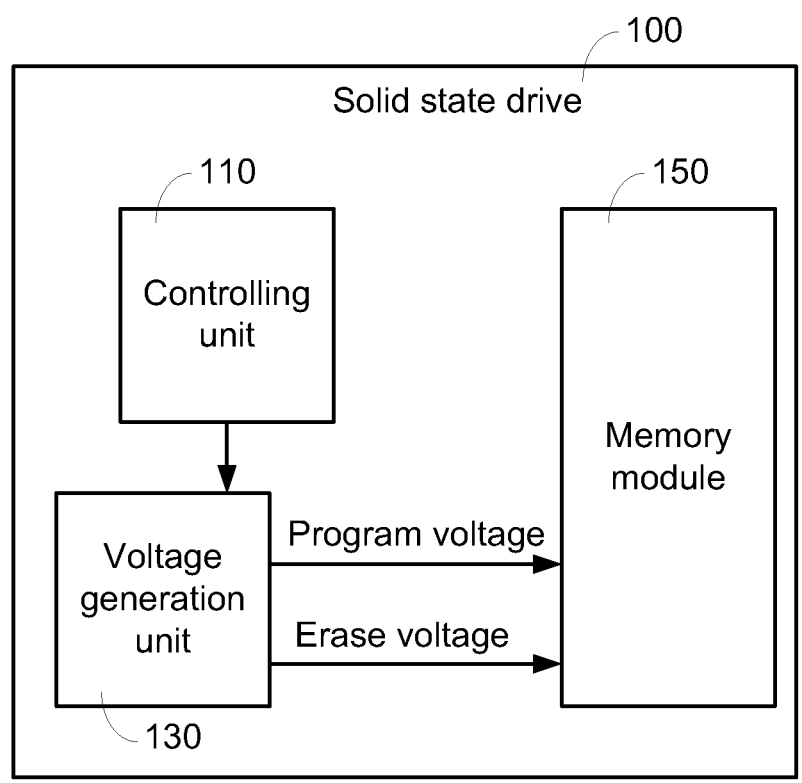
FIG. 3 is a schematic functional diagram illustrating a solid state drive according to an embodiment of the present invention.

FIG. 3 is a schematic functional diagram illustrating a solid state drive according to an embodiment of the present invention. As shown in FIG. 3, the solid state drive 100 comprises a controlling unit 110, a voltage generation unit 130, and a memory module 150. The memory module 150 is used for storing data. Moreover, the memory module 150 comprises plural cells. Each cell has an erase state and at least two storing states. The erase state of the cell is the storing state with the lowest threshold voltage. For example, if each cell can store two bits of data, each cell has an erase state (e.g. the storing state "11") and four storing states (e.g. the storing states 11", "10", "01" and "00"). The erase state of the cell is the storing state 11" with the lowest threshold voltage.

The voltage generation unit 130 may provide a program voltage. In response to the program voltage, the storing state of the cell of the memory module 150 is changed. Consequently, data can be stored into the memory module 150. Moreover, the voltage generation unit 130 may further provide an erase voltage. In response to the erase voltage, the cell is changed to have the erase state. Consequently, the data stored in the memory module 150 are erased.

The controlling unit 110 is used for controlling the timing of generating the program voltage and the erase voltage from the voltage generation unit 130, and controlling the magnitudes of the program voltage and the erase voltage. During the program cycle, the voltage generation unit 130 is controlled by the controlling unit 110 to generate a program voltage according to the storing state. The program voltage is provided to a corresponding block of the memory module 150 for storing data. Consequently, the cell of the block is changed to have the corresponding storing state, and the corresponding data are stored into the memory module 150.

In this embodiment, during the erase cycle, the voltage generation unit 130 is controlled by the controlling unit 110 to provide an erase voltage at a first time to a specified block of the memory module 150 whose data need to be erased. Consequently, the cell of the specified block is changed to have the erase state. Then, the voltage generation unit 130 is controlled by the controlling unit 110 to provide a temporary program voltage to the specified block. In response to the temporary program voltage, the cell of the block is changed to have a temporary storing state. Then, the voltage generation unit 130 is controlled by the controlling unit 110 to provide an erase voltage at a second time to the specified block. Consequently, the operations of the erase cycle are completed.

In this embodiment, the temporary program voltage is lower than the program voltage which is required for programming the cell to the storing state with the highest threshold voltage. Moreover, the threshold voltage of the temporary storing state is in the range between the threshold voltage of the erase state and the threshold voltage of the storing state with the highest threshold voltage.

Figure 4:
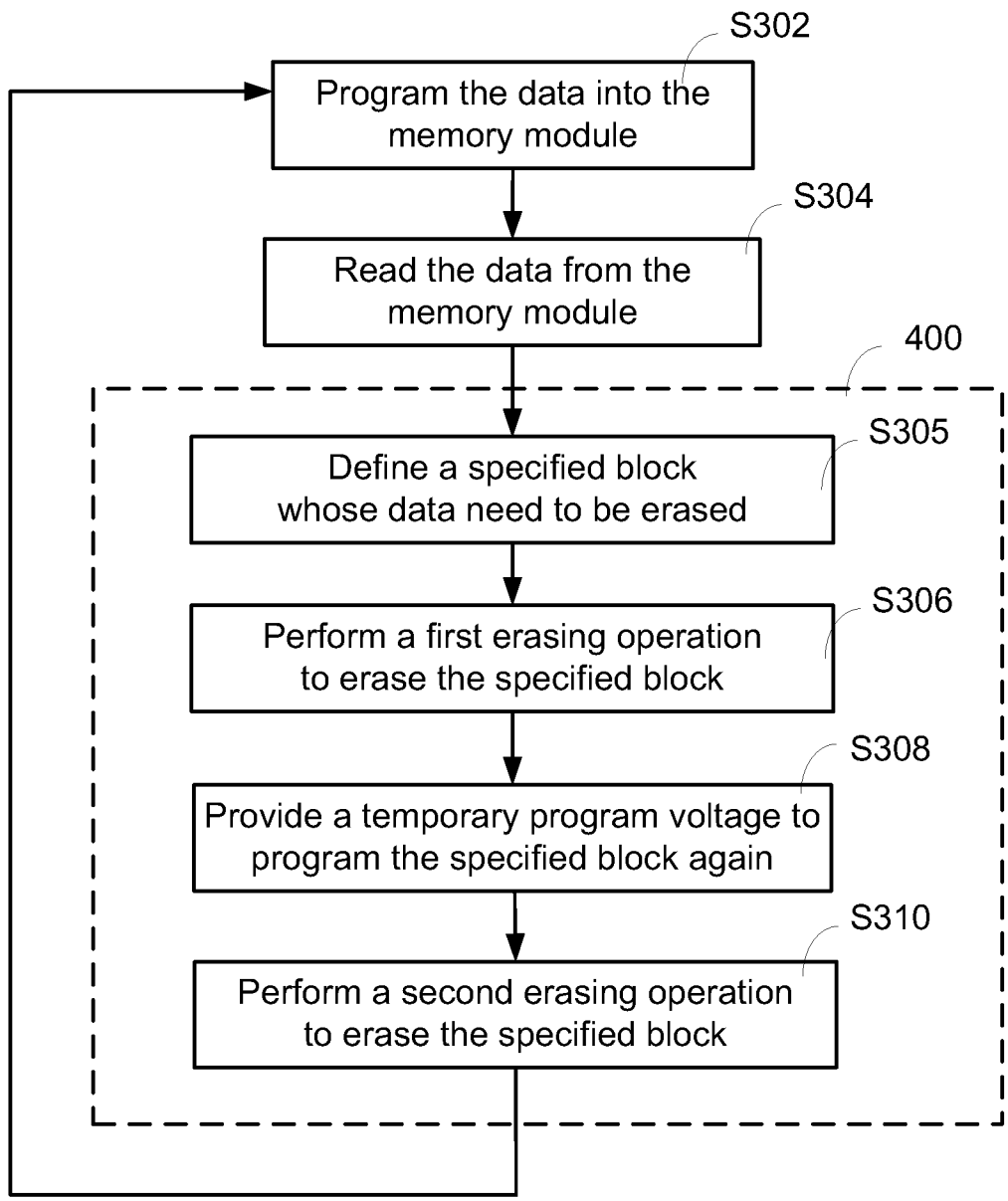
FIG. 4 is a flowchart illustrating a method of using a solid state drive according to an embodiment of the present invention.

FIG. 4 is a flowchart illustrating a method of using a solid state drive according to an embodiment of the present invention. After the solid state drive is used, the data are programmed into the memory module 150 (Step S302). After the data of the solid state drive are programmed, the data are read from the memory module by a host (Step S304). Generally, the times of reading data from the solid state drive are not restricted.

When the data stored in some blocks of the memory module 150 are no longer used, the stored data of these blocks may be erased during an erase cycle 400, which is indicated by dotted lines. During the erase cycle 400, a specified block whose data need to be erased is defined (Step S305). Then, a first erasing operation is performed to erase the specified block (Step S306). For preventing the hot carriers from being retained in the cell of the specified block, a temporary program voltage is provided to program the specified block again (Step S308). Then, a second erasing operation is performed to erase the specified block (Step S310). Meanwhile, the operations of the erase cycle 400 are completed. After the operations of the erase cycle of the solid state drive are completed, only small number of hot carriers may be retained. Consequently, the data may be programmed into the memory module again (Step S302).

In the step S305, the controlling unit 110 may firstly judge whether the data stored in the memory module are valid and label the block containing invalid data. After the block is subjected to the subsequent erase cycle, the space of the block can be re-used to store new data. After the specified block whose data need to be erased is defined, the voltage generation unit 130 is controlled by the controlling unit 110 to provide an erase voltage to a specified block of the memory module 150 for performing a first erasing operation (Step S306).

In the step S308, the voltage generation unit 130 is controlled by the controlling unit 110 to provide a temporary program voltage to program the specified block again. Consequently, the cell of the specified block is programmed to have a temporary storing state. In this embodiment, the temporary program voltage is lower than the program voltage which is required for programming the cell of the memory module to the storing state with the highest threshold voltage. Moreover, the threshold voltage corresponding to the temporary storing state is in the range between the threshold voltage of the erase state and the threshold voltage of the storing state with the highest threshold voltage. Afterwards, in the step S310, the voltage generation unit 130 is controlled by the controlling unit 110 to provide the erase voltage to the specified block of the memory module 150 for performing a second erasing operation. Meanwhile, the operations of the erase cycle are completed.

Hereinafter, a MLC flash memory for storing two bits of data per cell will be illustrated for example. Each cell has four storing states. If a third program voltage Vp3 is programmed to the cell, the storing state of the cell is changed from the storing state "11" to the storing state "00". The storing state "00" has the highest threshold voltage, and the storing state "11" has the lowest threshold voltage (see FIG. 4). Moreover, the erase state of the cell is the storing state "11" with the lowest threshold voltage.

For using the solid state drive, the data are firstly programmed into the memory module. Then, the data are read from the memory module. For erasing a specified block of the memory module containing invalid data, an erase cycle is performed. During the erase cycle, a first erasing operation is firstly performed to erase the specified block, then a temporary program voltage Vpt is provided to program the specified block, and finally a second erasing operation is performed to erase the specified block. The third program voltage Vp3 is higher than the temporary program voltage Vpt.

In this embodiment, the temporary program voltage Vpt is lower than the program voltage (e.g. the third program voltage Vp3) for programming the cell of the memory module to the storing state with the highest threshold voltage. In response to the temporary program voltage Vpt, the cell may be programmed to have the temporary storing state. Moreover, the threshold voltage corresponding to the temporary storing state is in the range between the threshold voltage of the erase state and the threshold voltage of the storing state with the highest threshold voltage.

Moreover, the cell is programmed to have a storing state "10" in response to a first program voltage Vp1, and the cell is programmed to have a storing state "01" in response to a second program voltage Vp2. The first program voltage Vp1 and the second program voltage Vp2 are both lower than the third program voltage Vp3. Consequently, the first program voltage Vp1 for programming the cell to the storing state "10" or the second program voltage Vp2 for programming the cell to the storing state "01" may be set as the temporary program voltage Vpt. If the temporary program voltage Vpt is equal to the first program voltage Vp1, the cell of the block is programmed to have the temporary storing state "10". If the temporary program voltage Vpt is equal to the second program voltage Vp2, the cell of the block is programmed to have the temporary storing state "01".

From the above descriptions, during the erase cycle of the solid state drive, the data of the memory module are erased in response to the erase voltage at a first time. For preventing the hot carriers from being retained in the cell of the block, a lower temporary program voltage is provided to program the memory module. Then, the data of the memory module are erased in response to the erase voltage at a second time.

In the above embodiments, the present invention is illustrated by referring to the multi-level cell (MLC) solid state drive. It is noted that the concepts of the present invention may be applied to a SLC solid state drive. By using the data erasing method of the present invention, the retained hot carriers can be effectively reduced. Consequently, the use life of the solid state drive is extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data erasing method of a solid state drive, the solid state drive comprising a memory module, the memory module comprising a block, a data to be erased being stored in the block, the data erasing method comprising steps of:

performing a first erasing operation to erase the block;
programming the block after the first erasing operation; and
performing a second erasing operation to erase the block;
wherein the memory module comprises plural cells, and each cells has at least two storing states, wherein the block after the first erasing operation is programmed in response to a temporary program voltage, wherein the temporary program voltage is lower than a program voltage, and the program voltage is configured for programming the cell to have the storing state with the highest threshold voltage.

2. A data erasing method of a solid state drive, the solid state drive comprising a memory module, the memory module comprising a block, a data to be erased being stored in the block, the data erasing method comprising steps of:
performing a first erasing operation to erase the block;
programming the block after the first erasing operation; and
performing a second erasing operation to erase the block;
wherein the memory module comprises plural cells, and each cells has an erase state and at least two storing states, wherein the cell of the block after the first erasing operation is programmed to have a temporary storing state, wherein a threshold voltage of the temporary storing state is in a range between a threshold voltage of the erase state and a threshold voltage of the storing state with the highest threshold voltage.

3. The data erasing method as claimed in claim 2, wherein the first erasing operation is performed to erase the block in response to an erase voltage.

4. The data erasing method as claimed in claim 2, wherein the second erasing operation is performed to erase the block in response to an erase voltage.

5. A solid state drive, comprising:
a memory module comprising a block, wherein a data to be erased is stored in the block; and
a controlling unit for providing a program voltage to the memory module during a program cycle, and sequentially performing a first erasing operation to erase the block, programming the block and performing a second erasing operation to erase the block during an erase cycle;
wherein the memory module comprises plural cells, and each cells has at least two storing states, wherein during the erase cycle, the block after the first erasing operation is programmed in response to a temporary program voltage, wherein the temporary program voltage is lower than a highest program voltage, and the highest program voltage is configured for programming the cell to have the storing state with the highest threshold voltage.

6. A solid state drive, comprising:
a memory module comprising a block, wherein a data to be erased is stored in the block; and
a controlling unit for providing a program voltage to the memory module during a program cycle, and sequentially performing a first erasing operation to erase the block, programming the block and performing a second erasing operation to erase the block during an erase cycle;
wherein the memory module comprises plural cells, and each cells has an erase state and at least two storing states, wherein during the erase cycle, the cell of the block after the first erasing operation is programmed to have a temporary storing state, wherein a threshold voltage of the temporary storing state is in a range between a threshold voltage of the erase state and a threshold voltage of the storing state with the highest threshold voltage.

7. The solid state drive as claimed in claim 6, wherein during the erase cycle, the controlling unit provides an erase voltage to the block, so that the first erasing operation is performed to erase the block.

8. The solid state drive as claimed in claim 6, wherein during the erase cycle, the controlling unit provides an erase voltage to the block, so that the second erasing operation is performed to erase the block.

* * * * *